Aug. 9, 1966 G. McNEIL 3,265,905

INTEGRATED SEMICONDUCTOR RESISTANCE ELEMENT

Filed Feb. 6, 1964

INVENTOR,
GORDON MC NEIL

BY Harry M. Saragovitz
Edward J. Kelly Herbert Berl
& Julian C. Keppler ATTORNEYS United States Patent Office 3,265,905
Patented August 9, 1966

3,265,905
INTEGRATED SEMICONDUCTOR RESISTANCE ELEMENT

Gordon McNeil, Long Branch, N.J., assignor to the United States of America as represented by the Secretary of the Army Filed Feb. 6, 1964, Ser. No. 343,162
3 Claims. (Cl. 307—88.5)

The invention described herein may be manufactured and used by or for the Government for governmental purposes without the payment of any royalty thereon.

This invention relates to integrated semiconductor devices, and more particularly to isolating resistance elements in said devices.

As is known, resistance elements and other electrical components included in a single integrated semiconductor structure are customarily formed in the epitaxial layer of semiconductor material deposited on a substrate. For practical operation in an integrated device, the resistance elements preferably should be electrically isolated so that they do not interfere with the operation of the other components in the device. For such isolation, resistance elements are characterized as substantially high impedance elements. An advantage of including in one integrated device several electrical elements is the smaller number of electrical connections required, since all the internal connections between individual elements are within the semiconductor body and thus inherent in the integrated structure.

One technique now in use for electrically isolating the resistance elements in one portion of an integrated device from the remainder of the device, has been to provide deep diffusions of semiconductor material completely through the epitaxial layer between the resistance element and the other components of the circuit arrangement. Not only do these deep diffusions require high temperatures to fabricate, but they also result in more junction movement and in significantly increased degradation of the semiconductor material.

Accordingly, it is an object of this invention to provide an improved resistance element to overcome the abovementioned limitations.

One illustrative embodiment in combination with a circuit formed in a P-type conductivity epitaxial layer of semiconductor material comprises an electrically isolated resistance element in a P-type conductivity resistance zone surrounded by an N-type conductivity isolating zone, said isolating zone forming a first P-N junction with said resistance zone and a second P-N junction with said epitaxial layer, a direct-current potential applied to said isolating zone, and said direct-current potential being of a magnitude and polarity such that a reverse bias is maintained in said isolating zone with respect to said resistance zone and said epitaxial layer.

Figure 1:
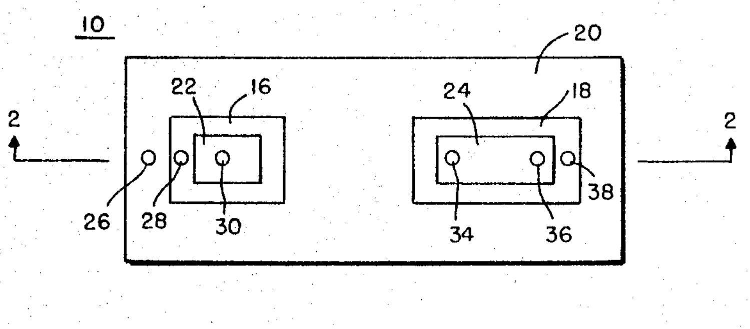
Figure 2:
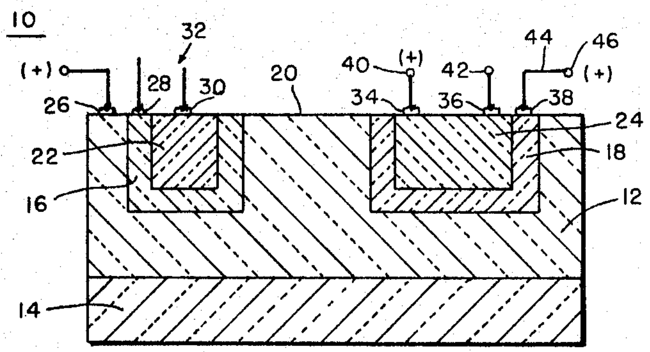

For a more detailed description of the invention together with other and further objects thereof, reference is had to the following description taken in connection with the accompanying drawing in which:

FIG. 1 is a plan view of a semiconductor structure in which the method of the present invention can be utilized; and FIG. 2 is a cross-sectional view of the structure of FIG. 1, taken along the line 2—2.

Referring to the drawing, the element 10, shown in FIGS. 1 and 2, comprises an epitaxial layer 12 of semiconductor material, more specifically of single crystal silicon of P-type conductivity extending across the cross section of the substrate 14, which may be of silicon, ceramic or glass. A pair of discrete N-type conductivity zones 16 and 18 form P–N junctions in surface 20 of epitaxial layer 12. Zones 16 and 18 are completely surrounded by the semiconductor material in layer 12. P–type conductivity zones 22 and 24 are contiguous, in turn, with a limited portion of N–type zones 16 and 18, respectively, as shown, and are completely surrounded thereby and form P–N junctions therewith. The semiconductor element 10 can be readily fabricated using known vapor solid diffusion methods.

The semiconductor element 10 is shown in connection with a single transistor, however other electrical devices such as diodes and capacitors may be included in element 10. The electrode 26 is attached to the P-type zone 12, electrode 28 to the N-type zone 16, and the electrode 30 to the P–type zone 22, to form a transistor 32 of a PNP arangement utilizing electrodes 26, 28 and 30, respectively, as collector, base and emitter. Spaced electrodes 34 and 36 are attached to P–type zone 24, and electrode 38 is attached to N–type zone 18. A lead 44 is connected between electrode 38 and direct-current voltage source 46. The terminals 40 and 42 are connected to respective electrodes 34 and 36. The resistance element which exists between electrodes 34 and 36 has a value determined by the body resistance of the semiconductor material in P–type conductivity resistance zone 24. The various electrical leads are attached by well-known bonding techniques to the electrodes described above.

Electrical separation from transistor 32 of the resistance element existing between electrodes 34 and 36, which may be connected in circuit with transistor 32 through leads 40 and 42, is achieved by applying to electrode 38 a direct-current potential having a magnitude and polarity such that a reverse bias is maintained in N-type conductivity zone 18 with respect to P-type conductivity zone 24 and P-type conductivity epitaxial layer 12. By such an arangement zone 18 provides an isolating zone with respect to zone 24 and layer 12. This direct-current potential applied to electrode 38 may have a greater positive potential with respect to electrode 28 of transistor 32 than the positive potentials existing at electrodes 26 and 34.

Although the foregoing embodiment has been described in terms of an integrated circuit including a PNP transistor and a P-type conductivity resistance zone 24, and an N-type conductivity isolating zone 18, it will be understood that other arrangements may be devised by those skilled in the art. For example, it is apparent that the conductivity type zones may be reversed within element 10 along with a reversal of the polarity of all the applied voltages. In that case, transistor 32 would be an NPN arrangement, and the negative voltage applied to electrode 38 with respect to the potential on electrode 28 would be of a greater negative potential than the negative potential applied to electrodes 26 and 34, so as to produce a reverse bias between isolating zone 18 and zones 12 and 24, respectively. Furthermore, element 10 including substrate 14, may comprise a semiconductor material of germanium, or the like.

While there has been described what is at present considered to be the preferred embodiment of the invention, it will be obvious to those skilled in the art that various changes and modifications may be made therein without departing from the invention, and it is therefore aimed in the appended claims to cover all such changes and modifications as fall within the true spirit and scope of the invention.

What is claimed is:

1. In combination, an epitaxial layer of integrated semiconductor material of a first conductivity type, a transistor having a collector, base and emitter, said collector including a portion of said layer, said base being a region of opposite conductivity type formed within said layer, said emitter being a region of first conductivity type formed within said base, and an electrically isolated resistance element in a resistance zone of said first conductivity type formed within said layer surrounded by an isolating zone of the opposite conductivity type, said isolating zone forming a first P-N junction with said resistance zone and a second P-N junction with said epitaxial layer, a direct-current potential applied to said isolating zone, and said direct-current potential being of a magnitude and polarity such that a reverse bias is maintained in said isolating zone with respect to said resistance zone and said epitaxial layer.

2. An electrically isolated resistance element according to claim 1 wherein said isolating zone is N-type conductivity silicon and both the resistance zone and the epitaxial layer are of P-type conductivity silicon.

3. An electrically isolated resistance element according to claim 1 wherein said isolating zone is P-type conductivity germanium and both the resistance zone and the epitaxial layer are of N-type conductivity germanium.

References Cited by the Examiner

UNITED STATES PATENTS

| | | | |
|---|---|---|---|
| 2,954,486 | 9/1960 | Doucette et al. | 317—235 |
| 3,010,033 | 11/1961 | Noyce | 317—235 |
| 3,114,366 | 8/1964 | Rideout et. al. | 317—235 |
| 3,183,128 | 5/1965 | Leistiko et al. | 317—235 |

FOREIGN PATENTS 1,257,419 2/1961 France.

OTHER REFERENCES

Electronics: "Wetting Agent Solves Photoetching Problem" by Barditch et al., December 13, 1963, pages 54–56.

JOHN W. HUCKERT, *Primary Examiner.*

J. D. CRAIG, *Assistant Examiner.*